United States Patent
Song (10) Patent No.: US 8,884,321 B2
(45) Date of Patent: Nov. 11, 2014

(54) LUMINOUS ELEMENT

(75) Inventor: June O. Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 673 days.

(21) Appl. No.: 12/936,477

(22) PCT Filed: Apr. 6, 2009

(86) PCT No.: PCT/KR2009/001765
§ 371 (c)(1),
(2), (4) Date: Feb. 24, 2011

(87) PCT Pub. No.: WO2009/125953
PCT Pub. Date: Oct. 15, 2009

(65) Prior Publication Data
US 2011/0180831 A1    Jul. 28, 2011

(30) Foreign Application Priority Data

Apr. 6, 2008  (KR) .................. 10-2008-0031928
Apr. 6, 2008  (KR) .................. 10-2008-0031929

(51) Int. Cl.
*H01L 33/00* (2010.01)
*H01L 33/38* (2010.01)
*H01L 33/40* (2010.01)
*H01L 27/15* (2006.01)

(52) U.S. Cl.
CPC ........... *H01L 27/15* (2013.01); *H01L 33/0033* (2013.01); *H01L 33/385* (2013.01); *H01L 33/405* (2013.01)
USPC ................... 257/98; 257/99; 257/13; 257/84; 438/22; 438/31

(58) Field of Classification Search
USPC .................. 257/84–99; 438/22–31
See application file for complete search history.

(56) References Cited

U.S. PATENT DOCUMENTS

| | | | | |
|---|---|---|---|---|
| 5,309,001 | A | * | 5/1994 | Watanabe et al. ............ 257/99 |
| 6,281,030 | B1 | * | 8/2001 | Shimizu ...................... 438/31 |
| 6,841,802 | B2 | * | 1/2005 | Yoo ............................. 257/98 |
| 8,217,417 | B2 | * | 7/2012 | Pan et al. .................... 257/99 |
| 2002/0074558 | A1 | * | 6/2002 | Hata et al. ................... 257/89 |
| 2006/0081857 | A1 | * | 4/2006 | Hong et al. .................. 257/84 |
| 2008/0230765 | A1 | * | 9/2008 | Yoon et al. .................. 257/13 |

FOREIGN PATENT DOCUMENTS

| | | |
|---|---|---|
| JP | 2007-042976 | 2/2007 |
| KR | 2005-0082259 | 8/2005 |
| KR | 2006-0091718 | 8/2006 |

OTHER PUBLICATIONS

International Search Report issued in PCT/KR2009/001765 dated Nov. 26, 2009.

* cited by examiner

*Primary Examiner* — Eugene Lee
*Assistant Examiner* — Fang-Xing Jiang
(74) *Attorney, Agent, or Firm* — Ked & Associates, LLP (57) ABSTRACT

A light emitting device according to the embodiment includes a first conductive semiconductor layer; an active layer over the first conductive semiconductor layer; a second conductive semiconductor layer over the active layer; a bonding layer over the second conductive semiconductor layer; a schottky diode layer over the bonding layer; an insulating layer for partially exposing the bonding layer, the schottky diode layer, and the first conductive semiconductor layer; a first electrode layer electrically connected to both of the first conductive semiconductor layer and the schottky diode layer; and a second electrode layer electrically connected to the bonding layer.

18 Claims, 4 Drawing Sheets

LUMINOUS ELEMENT

TECHNICAL FIELD

The embodiment relates to a light emitting device.

BACKGROUND ART

Recently, a light emitting diode (LED) is spotlighted as a light emitting device. Since the LED can convert electric energy into light energy with high efficiency and long life span of about 5 years or more, the LED can remarkably reduce the energy consumption and repair and maintenance cost. In this regard, the LED is spotlighted in the next-generation lighting field.

Such an LED is prepared as a light emitting semiconductor layer including a first conductive semiconductor layer, an active layer and a second conductive semiconductor layer, in which the active layer generates light according to current applied thereto through the first and second conductive semiconductor layers.

Meanwhile, the LED may be damaged due to electrostatic discharge (ESD), so an ESD protection device is installed together with the LED.

However, if the ESD protection device is installed together with the LED, the productivity of the LED may be lowered due to the size of the ESD protection device and the complicated process is required to manufacture the ESD protection device.

DISCLOSURE

Technical Problem

The embodiment provides a light emitting device having a novel structure.

The embodiment provides a light emitting device capable of improving the electrical characteristic.

The embodiment provides a light emitting device having an ESD protection function.

Technical Solution

A light emitting device according to the embodiment may include a first conductive semiconductor layer; an active layer over the first conductive semiconductor layer; a second conductive semiconductor layer over the active layer; a bonding layer over the second conductive semiconductor layer; a schottky diode layer over the bonding layer; an insulating layer for partially exposing the bonding layer, the schottky diode layer, and the first conductive semiconductor layer; a first electrode layer electrically connected to both of the first conductive semiconductor layer and the schottky diode layer; and a second electrode layer electrically connected to the bonding layer.

A light emitting device according to the embodiment may include a first conductive semiconductor layer; an active layer over the first conductive semiconductor layer; a second conductive semiconductor layer over the active layer; a bonding layer over the second conductive semiconductor layer; a p-n junction diode layer over the bonding layer; an insulating layer for partially exposing the bonding layer, the p-n junction diode layer, and the first conductive semiconductor layer; a first electrode layer electrically connected to both of the first conductive semiconductor layer and the p-n junction diode layer; and a second electrode layer electrically connected to the bonding layer.

Advantageous Effects

The embodiment can provide a light emitting device having a novel structure.

The embodiment can provide a light emitting device capable of improving the electrical characteristic.

The embodiment can provide a light emitting device having an ESD protection function.

BEST MODE

Mode for Invention

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Figure 1:
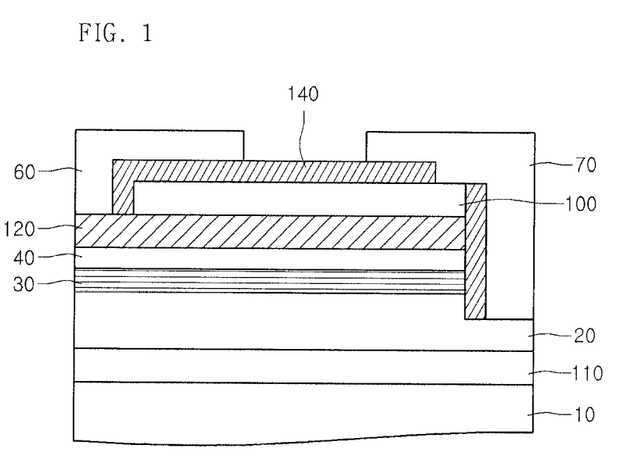
FIG. 1 is a sectional view showing a light emitting device according to the first embodiment.

FIG. 1 is a sectional view showing a light emitting device according to the first embodiment.

Referring to FIG. 1, a buffer layer 110 is formed on a growth substrate 10, and a light emitting semiconductor layer including a first conductive semiconductor layer 20, an active layer 30, and a second conductive semiconductor layer 40 is formed on the buffer layer 110.

The light emitting semiconductor layer is partially removed through MESA etching so that apart of the first conductive semiconductor layer 20 is exposed upward.

A reflective bonding layer 120 is formed on the second conductive semiconductor layer 40, and a schottky diode layer 100 is partially formed on the reflective bonding layer 120.

An insulating layer 140 is formed on the reflective bonding layer 120, the schottky diode layer 100 and the first conductive semiconductor layer 20.

The insulating layer 140 surrounds a lateral side of the schottky diode layer 100 while partially exposing the reflective bonding layer 120. In addition, the insulating layer 140 allows the top surface of the schottky diode layer 100 to be partially exposed. Further, the insulating layer 140 surrounds the schottky diode layer 100, the reflective bonding layer 120, the second conductive semiconductor layer 40, and the active layer 30 while partially exposing the top surface of the first conductive semiconductor layer 20.

Due to the insulating layer 140, the first conductive semiconductor layer 20, the reflective bonding layer 120 and the schottky diode layer 100 are partially exposed to the outside.

A first electrode layer 70 is formed on the first conductive semiconductor layer 20 and the schottky diode layer 100, and a second electrode layer 60 is formed on the reflective bonding layer 120.

The first electrode layer 70 is electrically connected to both of the first conductive semiconductor layer 20 and the schottky diode layer 100, and the second electrode layer 60 is electrically connected to both of the second conductive semiconductor layer 40 and the schottky diode layer 100 through the reflective bonding layer 120. The first electrode layer 70 and the second electrode layer 60 have top surfaces aligned in the same plane, so the light emitting device can be easily connected to the circuit board through the first electrode layer 70 and the second electrode layer 60.

Thus, the light emitting semiconductor layer and the schottky diode layer 100 are connected to the first electrode layer 70 and the second electrode layer 60 in parallel, so that the light emitting semiconductor layer can be protected from the ESD by allowing current to flow through the schottky diode layer 100 when the ESD is applied from the outside. That is, the schottky diode layer 100 has the ESD protection function in the light emitting device.

According to the embodiment, the ESD protection device is not manufactured separately from the light emitting device, but the light emitting device has the ESD protection function, so that the complicated process for manufacturing the ESD protection device can be omitted and the installation space for the ESD protection device on the growth substrate 100 can be reduced.

In more detail, for example, the growth substrate 10 may include one of $Al_2O_3$, SiC, Si, AlN, GaN, AlGaN, glass and GaAs.

Before the first conductive semiconductor layer 20 is grown, the buffer layer 110 is formed on the growth substrate 10. For instance, the buffer layer 110 may include at least one of InGaN, AlN, SiC, SiCN, and GaN.

The light emitting semiconductor layer including the first conductive semiconductor layer 20, the active layer 30, and the second conductive semiconductor layer 40 may include group-III nitride-based semiconductor materials. For example, the first conductive semiconductor layer 20 may include a gallium nitride layer including n type impurities such as Si, and the second conductive semiconductor layer 40 may include a gallium nitride layer including p type impurities such as Mg or Zn. In addition, the active layer 30, which generates light through the recombination of electrons and holes, may include one of InGaN, AlGaN, GaN, and AlInGaN. The wavelength of light emitted from the light emitting device is determined according to the type of materials constituting the active layer 30.

The active layer 30 and the second conductive semiconductor layer 40 are formed on a part of the first conductive semiconductor layer 20. In other words, one part of the first conductive semiconductor layer 20 perpendicularly overlaps with the active layer 30.

Although not shown, an interface modification layer may be further formed on the second conductive semiconductor layer 40.

The interface modification layer may include a superlattice structure, one of InGaN, GaN, AlInN, AlN, InN, and AlGaN doped with first conductive impurities, one of InGaN, GaN, AlInN, AlN, InN, and AlGaN doped with second conductive impurities, or one of group III nitride-based elements having nitrogen-polar surfaces. In particular, the interface modification layer having the superlattice structure may include nitride or carbon nitride including group II, III, or IV elements.

The reflective bonding layer 120 has reflective and electric conductive properties while forming an ohmic contact interface with respect to the second conductive semiconductor layer 40 and a schottky contact interface with respect to the schottky diode layer 100.

The reflective bonding layer 120 may include a metal or an alloy including one selected from the group consisting of Al, Ag, Rh, Pd, Au, Ni, and Cr. In addition, the reflective bonding layer 120 can be prepared as a DBR (Distributed Bragg Reflector), or an ODR (Omni-Directional Reflector).

The reflective bonding layer 120 includes a first reflective bonding layer 120a adjacent to the second conductive semiconductor layer 40, and a second reflective bonding layer 120b formed on the first reflective bonding layer 120a in adjacent to the schottky diode layer 100.

For instance, the first reflective bonding layer 120a can be formed by using Ag or an alloy including Ag, and the second reflective bonding layer 120b can be formed by using Al or an alloy including Al.

The schottky diode layer 100 may include a semiconductor layer doped with n type or p type impurities regardless of the crystal state thereof, such as the amorphous state, the single crystalline state or the polycrystalline state.

For instance, the schottky diode layer 100 can be prepared as a single-layer structure or a multiple layer structure having single electric conductivity by using at least one of Si, Ge, C, SiGe, SiC, SiCN, group II-VI compounds and group III-V compounds. The term "single electric conductivity" refers that majority carriers in the schottky diode layer 100 have electric conductivity based on only electrons or holes.

The insulating layer 140 electrically protects the light emitting semiconductor layer and allows the first and second electrode layers 70 and 60 to selectively make electric connection with the first conductive semiconductor layer 20, the reflective bonding layer 120 and the schottky diode layer 100.

For instance, the insulating layer 140 may include at least one of $SiO_2$ (silicon dioxide), $SiN_x$ (silicon nitride), $MgF_2$ (magnesium fluoride), $Cr_2O_3$ (chromium oxide), $Al_2O_3$ (aluminum oxide), $TiO_2$, ZnS (zinc sulfide), ZnO (zinc oxide), $CaF_2$ (calcium fluoride), AlN (aluminum nitride), and CrN (chromium nitride).

The first electrode layer 70 is electrically connected to the schottky diode layer 100 and the first conductive semiconductor layer 20 in such a manner that the schottky contact interface can be formed between the first electrode layer 70 and the schottky diode layer 100 and the ohmic contact interface can be formed between the first electrode layer 70 and the first conductive semiconductor layer 20.

The second electrode layer 60 is electrically connected to the reflective bonding layer 120 in such a manner that ohmic contact interface can be formed between the second electrode layer 60 and the reflective bonding layer 120.

FIGS. 2 to 8 are sectional views showing the procedure for manufacturing the light emitting device according to the first embodiment.

Figure 2:
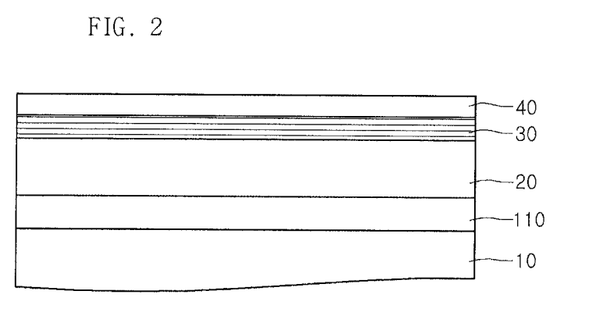
FIGS. 2 to 8 are sectional views showing the procedure for manufacturing a light emitting device according to the first embodiment.

Referring to FIG. 2, the buffer layer 110 is formed on the growth substrate 10, and the light emitting semiconductor layer including the first conductive semiconductor layer 20, the active layer 30, and the second conductive semiconductor layer 40 is formed on the buffer layer 110, thereby preparing a first structure. Although not shown in the drawings, an interface modification layer can be further formed on the second conductive semiconductor layer 40.

Figure 3:
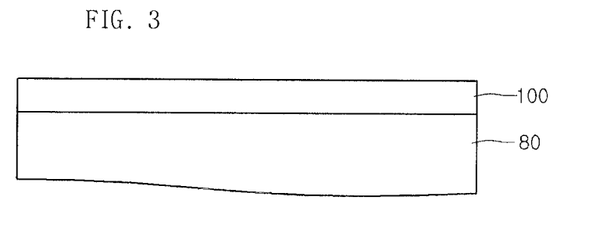

Referring to FIG. 3, the schottky diode layer 100 is formed on a temporary substrate 80, thereby preparing a second structure.

For instance, the temporary substrate 80 may include one of optically transparent sapphire, glass, aluminum nitride, SiC, ZnO, GaAS, Si, Ge and SiGe.

Although not shown in the drawings, a buffering layer can be formed between the temporary substrate 80 and the schottky diode layer 100 to attenuate stress caused by difference in lattice constant and thermal expansion coefficient between the temporary substrate 80 and the schottky diode layer 100.

Figure 4:
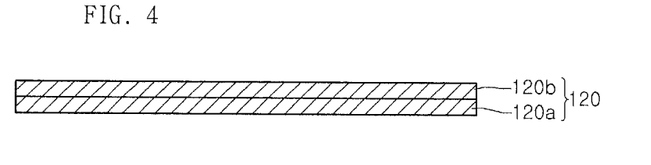

Referring to FIG. 4, a third structure is prepared by using the reflective bonding layer 120.

The reflective bonding layer 120 includes the first reflective bonding layer 120a and the second reflective bonding layer 120b.

Figure 5:
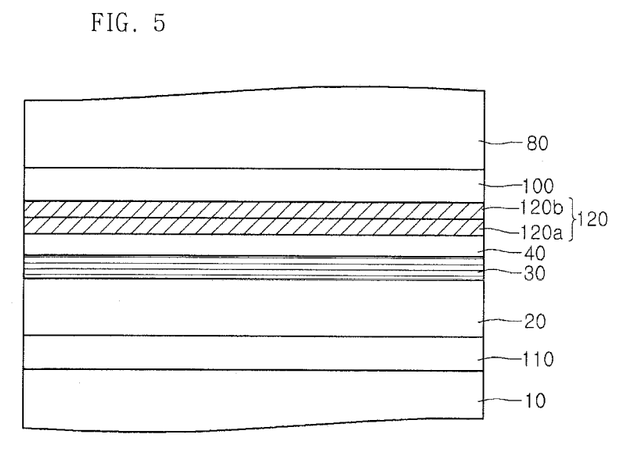

Referring to FIG. 5, the first and second structures are bonded with each other while interposing the third structure therebetween.

That is, the first reflective bonding layer 120a is bonded to the second conductive semiconductor layer 40 and the second reflective bonding layer 120b is bonded to the schottky diode layer 100, thereby forming a complex structure.

The complex structure can be formed by performing the wafer bonding process under the conditions of the temperature of 900° C. or below and hydrostatic pressure.

In order to form the schottky contact interface between the schottky diode layer 100 and the second reflective bonding layer 120b and the ohmic contact interface between the second conductive semiconductor layer 40 and the first reflective bonding layer 120a, the annealing process may be performed with respect to the schottky diode layer 100 and the second conductive semiconductor layer 40 under the appropriate temperature and gas atmosphere or the surface treatment may be preformed with respect to the schottky diode layer 100 and the second conductive semiconductor layer 40 by using the solution or plasma before the complex structure has been formed.

Meanwhile, although the first embodiment discloses that the schottky contact interface is formed between the schottky diode layer 100 and the second reflective bonding layer 120b and the ohmic contact interface is formed between the second conductive semiconductor layer 40 and the first reflective bonding layer 120a, it is also possible to form the ohmic contact interface between the schottky diode layer 100 and the second reflective bonding layer 120b and between the second conductive semiconductor layer 40 and the first reflective bonding layer 120a.

Figure 6:
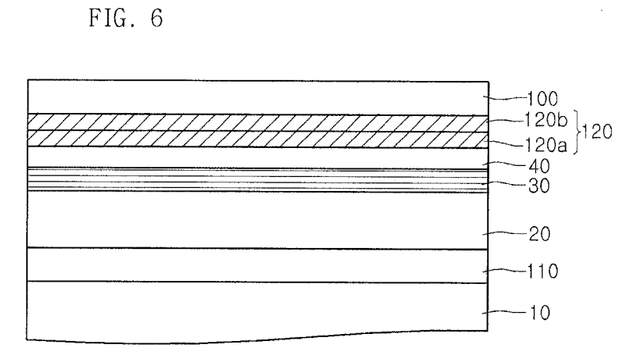

Referring to FIG. 6, the temporary substrate 80 is separated from the complex structure.

The process for separating the temporary substrate 80 from the complex structure may be determined according to the characteristic of the temporary substrate 80. For instance, at least one of the chemical laser liftoff (CLO), the chemical mechanical polishing (CMP) and the laser liftoff (LLO) can be employed to separate the temporary substrate 80 from the complex structure.

Figure 7:
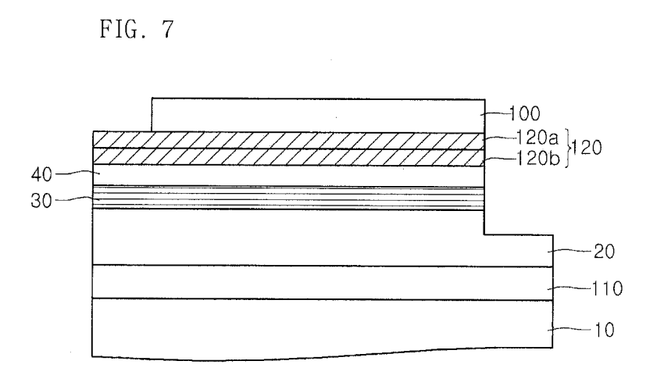

Referring to FIG. 7, the schottky diode layer 100, the reflective bonding layer 120, the second conductive semiconductor layer 40, the active layer 30 and the first conductive semiconductor layer 20 are selectively etched to partially expose the first conductive semiconductor layer 20 and the reflective bonding layer 120.

According to another embodiment, the schottky diode layer 100, the reflective bonding layer 120, the second conductive semiconductor layer 40, the active layer 30 and the first conductive semiconductor layer 20 are aligned as shown in FIG. 7 when preparing the first to third structures, and the complex structure is formed as shown in FIG. 5, and then the temporary substrate 80 is separated from the complex structure.

Figure 8:
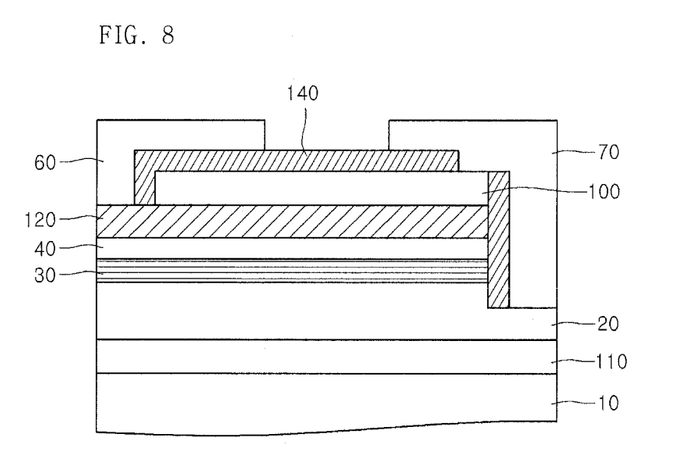

Referring to FIG. 8, the insulating layer 140 is formed in such a manner that the reflective bonding layer 120, the schottky diode layer 100, and the first conductive semiconductor layer 20 can be selectively exposed. Then, the second electrode 60 is electrically connected to the reflective bonding layer 120, and the first electrode 70 is electrically connected to the schottky diode layer 100 and the first conductive semiconductor layer 20.

Although not shown in drawings, a functional thin film layer including an electric insulating heterogeneous material, a luminescent material, a non-reflective material, or a light filtering material can be formed on the schottky diode layer 100. In addition, a concave-convex structure can be formed on the schottky diode layer 100 before the functional thin film layer is formed, or the concave-convex structure can be formed on the functional thin film layer.

In this manner, the light emitting device according to the first embodiment is manufactured.

Figure 9:
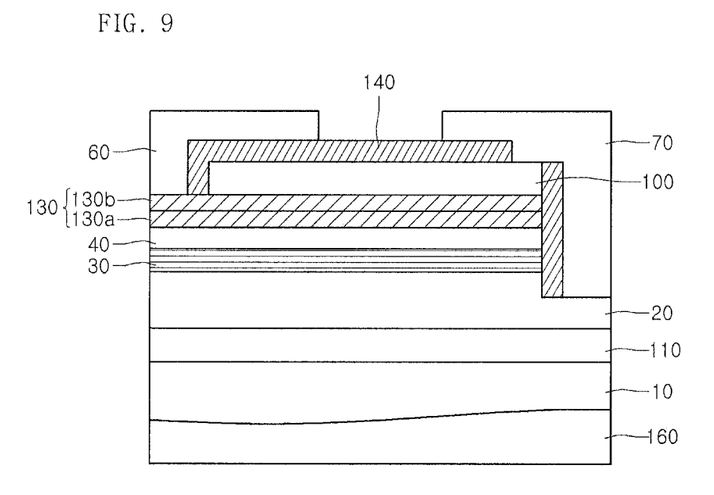
FIG. 9 is a sectional view showing a light emitting device according to the second embodiment.

FIG. 9 is a view showing a light emitting device according to the second embodiment.

The light emitting device according to the second embodiment has the structure similar to that of the light emitting device according to the first embodiment. Therefore, the following description will be focused on the difference from the light emitting device according to the first embodiment in order to avoid redundancy.

Referring to FIG. 9, a buffer layer 110 is formed on a growth substrate 10, and a light emitting semiconductor layer including a first conductive semiconductor layer 20, an active layer 30, and a second conductive semiconductor layer 40 is formed on the buffer layer 110.

The light emitting semiconductor layer is partially removed through MESA etching so that apart of the first conductive semiconductor layer 20 is exposed upward.

A transparent bonding layer 130 is formed on the second conductive semiconductor layer 40, and a schottky diode layer 100 is partially formed on the transparent bonding layer 130.

An insulating layer 140 is formed on the transparent bonding layer 130, the schottky diode layer 100 and the first conductive semiconductor layer 20.

The insulating layer 140 surrounds a lateral side of the schottky diode layer 100 while partially exposing the transparent bonding layer 130. In addition, the insulating layer 140 allows the top surface of the schottky diode layer 100 to be partially exposed. Further, the insulating layer 140 surrounds the schottky diode layer 100, the transparent bonding layer 130, the second conductive semiconductor layer 40, and the active layer 30 while partially exposing the top surface of the first conductive semiconductor layer 20.

Due to the insulating layer 140, the first conductive semiconductor layer 20, the transparent bonding layer 120 and the schottky diode layer 100 are partially exposed to the outside.

A first electrode layer 70 is formed on the first conductive semiconductor layer 20 and the schottky diode layer 100, and a second electrode layer 60 is formed on the transparent bonding layer 130.

The first electrode layer 70 is electrically connected to both of the first conductive semiconductor layer 20 and the schottky diode layer 100 such that the schottky contact interface can be formed between the first electrode layer 70 and the schottky diode layer 100 and the ohmic contact interface can be formed between the first electrode layer 70 and the first conductive semiconductor layer 20.

The second electrode layer 60 is electrically connected to both of the second conductive semiconductor layer 40 and the schottky diode layer 100 through the transparent bonding layer 130 such that the ohmic contact interface can be formed between the second electrode layer 60 and the transparent bonding layer 130.

Thus, the light emitting semiconductor layer and the schottky diode layer 100 are connected to the first electrode layer 70 and the second electrode layer 60 in parallel, so that the light emitting semiconductor layer can be protected from the ESD by allowing current to flow through the schottky diode layer 100 when the ESD is applied from the outside. That is, the schottky diode layer 100 has the ESD protection function in the light emitting device.

According to the embodiment, the ESD protection device is not manufactured separately from the light emitting device, but the light emitting device has the ESD protection function, so that the complicated process for manufacturing the ESD protection device can be omitted and the installation space for the ESD protection device on the growth substrate 100 can be reduced.

The transparent bonding layer 130 has the light transmittive and electric conductive properties while forming the ohmic contact interface with respect to the second conductive semiconductor layer 40 and the schottky contact interface with respect to the schottky diode layer 100.

The transparent bonding layer 130 may include at least one selected from the group consisting of NiO, Au, $IrO_2$, Ir, $RuO_2$, Ru, Pt, PtO, Pd, PdO, ITO, ZnO, IZO, ZITO, $SnO_2$, $In_2O_3$, and TiN.

The transparent bonding layer 130 includes a first transparent bonding layer 130a adjacent to the second conductive semiconductor layer 40, and a second transparent bonding layer 130b formed on the first transparent bonding layer 130a in adjacent to the schottky diode layer 100.

For instance, the first transparent bonding layer 130a can be formed by using NiO including Au distributed therein, and the second transparent bonding layer 130b can be formed by using ZnO.

Meanwhile, although the second embodiment discloses that the schottky contact interface is formed between the schottky diode layer 100 and the second transparent bonding layer 130b and the ohmic contact interface is formed between the second conductive semiconductor layer 40 and the first transparent bonding layer 130a, it is also possible to form the ohmic contact interface between the schottky diode layer 100 and the second reflective bonding layer 120b and between the second conductive semiconductor layer 40 and the first reflective bonding layer 120a.

In addition, a reflective layer 160 can be formed under the growth substrate 10. The light generated from the active layer 30 and traveled downward through the growth substrate 10 is reflected upward by the reflective layer 160, so that the light efficiency of the light emitting device can be improved.

The method of manufacturing the light emitting device according to the second embodiment is similar to that of the first embodiment except that the transparent bonding layer 130 is employed instead of the reflective bonding layer 120 and the reflective layer 160 can be selectively formed under the growth substrate 10.

Figure 10:
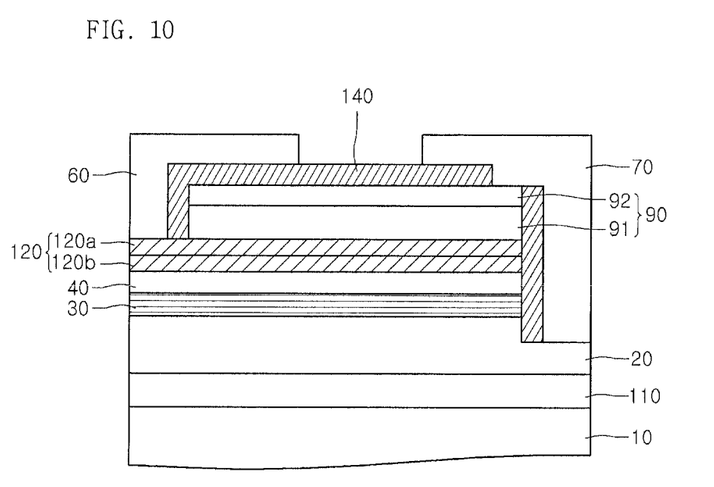
FIG. 10 is a sectional view showing a light emitting device according to the third embodiment.

FIG. 10 is a view showing a light emitting device according to the third embodiment.

The light emitting device according to the third embodiment has the structure similar to that of the light emitting device according to the first embodiment. Therefore, the following description will be focused on the difference from the light emitting device according to the first embodiment in order to avoid redundancy.

According to the third embodiment, instead of the schottky diode layer 100, a p-n junction diode layer 90 is formed on a reflective bonding layer 120.

Referring to FIG. 10, a buffer layer 110 is formed on a growth substrate 10, and a light emitting semiconductor layer including a first conductive semiconductor layer 20, an active layer 30, and a second conductive semiconductor layer 40 is formed on the buffer layer 110.

The light emitting semiconductor layer is partially removed through MESA etching so that a part of the first conductive semiconductor layer 20 is exposed upward.

A reflective bonding layer 120 is formed on the second conductive semiconductor layer 40, and the p-n junction diode layer 90 is partially formed on the reflective bonding layer 120.

An insulating layer 140 is formed on the reflective bonding layer 120, the p-n junction diode layer 90 and the first conductive semiconductor layer 20.

The insulating layer 140 surrounds a lateral side of the p-n junction diode layer 90 while partially exposing the reflective bonding layer 120. In addition, the insulating layer 140 allows the top surface of the p-n junction diode layer 90 to be partially exposed. Further, the insulating layer 140 surrounds the p-n junction diode layer 90, the reflective bonding layer 120, the second conductive semiconductor layer 40, and the active layer 30 while partially exposing the top surface of the first conductive semiconductor layer 20.

Due to the insulating layer 140, the first conductive semiconductor layer 20, the reflective bonding layer 120 and the p-n junction diode layer 90 are partially exposed to the outside.

A first electrode layer 70 is formed on the first conductive semiconductor layer 20 and the p-n junction diode layer 90, and a second electrode layer 60 is formed on the reflective bonding layer 120.

The first electrode layer 70 is electrically connected to both of the first conductive semiconductor layer 20 and the p-n junction diode layer 90, and the second electrode layer 60 is electrically connected to both of the second conductive semiconductor layer 40 and the p-n junction diode layer 90 through the reflective bonding layer 120.

Thus, the light emitting semiconductor layer and the p-n junction diode layer 90 are connected to the first electrode layer 70 and the second electrode layer 60 in parallel, so that the light emitting semiconductor layer can be protected from the ESD by allowing current to flow through the p-n junction diode layer 90 when the ESD is applied from the outside. That is, the p-n junction diode layer 90 has the ESD protection function in the light emitting device.

According to the embodiment, the ESD protection device is not manufactured separately from the light emitting device, but the light emitting device has the ESD protection function, so that the complicated process for manufacturing the ESD protection device can be omitted and the installation space for the ESD protection device on the growth substrate 100 can be reduced.

Meanwhile, the reflective bonding layer 120 has reflective and electric conductive properties while forming ohmic contact interfaces with respect to the second conductive semiconductor layer 40 and the p-n junction diode layer 90.

For instance, the reflective bonding layer 120 may include a metal or an alloy including one selected from the group consisting of Al, Ag, Rh, Pd, Au, Ni, and Cr. In addition, the reflective bonding layer 120 can be prepared as a DBR (Distributed Bragg Reflector), or an ODR (Omni-Directional Reflector).

The reflective bonding layer 120 includes a first reflective bonding layer 120a adjacent to the second conductive semiconductor layer 40, and a second reflective bonding layer 120b formed on the first reflective bonding layer 120a in adjacent to the p-n junction diode layer 90.

For instance, the first reflective bonding layer 120a can be formed by using Ag or an alloy including Ag, and the second reflective bonding layer 120b can be formed by using Al or an alloy including Al.

The p-n junction diode layer 90 may include first and second p-n junction diode layers 91 and 92 with the n type and p type semiconductor properties. In addition, the p-n junction diode layer 90 can be prepared as a multiple structure including the p-n junctions or the n-p junctions.

For instance, the p-n junction diode layer 90 can be prepared as a single-layer structure or a multiple layer structure by using at least one of Si, Ge, C, SiGe, SiC, SiCN, group II-VI compounds and group III-V compounds.

In detail, the first/second p-n junction diode layers 91 and may include one of p-GaN/n-GaN, p-GaN/n-ZnO, p-Si/n-Si, p-GaAs/n-GaAs, p-Si/n-ZnO, and p-GaAs/n-ZnO.

The first electrode layer 70 is formed on the first conductive semiconductor layer 20 and the p-n junction diode layer 90, and the second electrode layer 60 is formed on the reflective bonding layer 120.

The first electrode layer 70 is electrically connected to both of the first conductive semiconductor layer 20 and the p-n junction diode layer 90 in such a manner that the ohmic contact interface can be formed between the first electrode layer 70 and the p-n junction diode layer 90 and between the first electrode layer 70 and the first conductive semiconductor layer 20.

The second electrode layer 60 is electrically connected to both of the second conductive semiconductor layer 40 and the p-n junction diode layer 90 through the reflective bonding layer 120 in such a manner that the ohmic contact interface can be formed between the second electrode layer 60 and the reflective bonding layer 120.

The method of manufacturing the light emitting device according to the third embodiment is similar to that of the first embodiment except that the p-n junction diode layer 90 is employed instead of the schottky diode layer 100.

Figure 11:
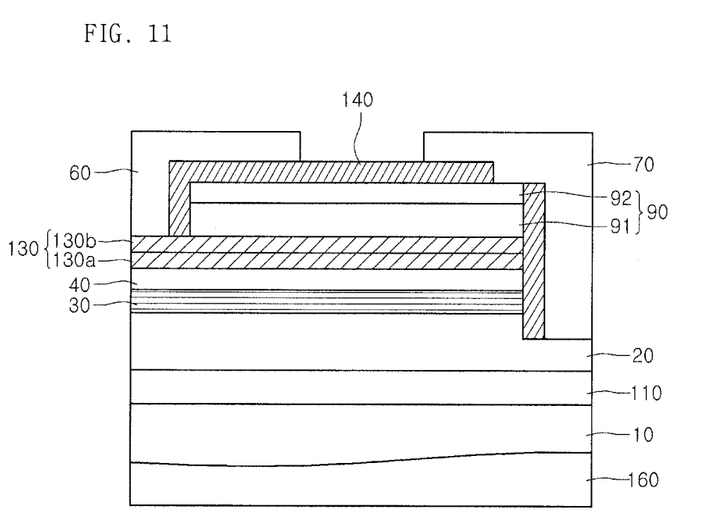
FIG. 11 is a sectional view showing a light emitting device according to the fourth embodiment.

FIG. 11 is a view showing a light emitting device according to the fourth embodiment.

The light emitting device according to the fourth embodiment has the structure similar to that of the light emitting device according to the third embodiment. Therefore, the following description will be focused on the difference from the light emitting device according to the third embodiment in order to avoid redundancy.

According to the fourth embodiment, instead of the reflective bonding layer 120, the transparent bonding layer 130 is formed on the second conductive semiconductor layer 40.

Referring to FIG. 11, a buffer layer 110 is formed on a growth substrate 10, and a light emitting semiconductor layer including a first conductive semiconductor layer 20, an active layer 30, and a second conductive semiconductor layer 40 is formed on the buffer layer 110.

The light emitting semiconductor layer is partially removed through MESA etching so that apart of the first conductive semiconductor layer 20 is exposed upward.

The transparent bonding layer 130 is formed on the second conductive semiconductor layer 40, and the p-n junction diode layer 90 is partially formed on the transparent bonding layer 130.

An insulating layer 140 is formed on the transparent bonding layer 130, the p-n junction diode layer 90 and the first conductive semiconductor layer 20.

The insulating layer 140 surrounds a lateral side of the p-n junction diode layer 90 while partially exposing the transparent bonding layer 130. In addition, the insulating layer 140 allows the top surface of the p-n junction diode layer 90 to be partially exposed. Further, the insulating layer 140 surrounds the p-n junction diode layer 90, the transparent bonding layer 130, the second conductive semiconductor layer 40, and the active layer 30 while partially exposing the top surface of the first conductive semiconductor layer 20.

Due to the insulating layer 140, the first conductive semiconductor layer 20, the transparent bonding layer 130 and the p-n junction diode layer 90 are partially exposed to the outside.

A first electrode layer 70 is formed on the first conductive semiconductor layer 20 and the p-n junction diode layer 90, and a second electrode layer 60 is formed on the transparent bonding layer 130.

The first electrode layer 70 is electrically connected to both of the first conductive semiconductor layer 20 and the p-n junction diode layer 90, and the second electrode layer 60 is electrically connected to both of the second conductive semiconductor layer 40 and the p-n junction diode layer 90 through the transparent bonding layer 130.

Thus, the light emitting semiconductor layer and the p-n junction diode layer 90 are connected to the first electrode layer 70 and the second electrode layer 60 in parallel, so that the light emitting semiconductor layer can be protected from the ESD by allowing current to flow through the p-n junction diode layer 90 when the ESD is applied from the outside. That is, the p-n junction diode layer 90 has the ESD protection function in the light emitting device.

According to the embodiment, the ESD protection device is not manufactured separately from the light emitting device, but the light emitting device has the ESD protection function, so that the complicated process for manufacturing the ESD protection device can be omitted and the installation space for the ESD protection device on the growth substrate 100 can be reduced.

Meanwhile, the transparent bonding layer 130 has light transmittive and electric conductive properties while forming ohmic contact interfaces with respect to the second conductive semiconductor layer 40 and the p-n junction diode layer 90.

For instance, the transparent bonding layer 130 may include at least one selected from the group consisting of NiO, Au, IrO$_2$, Ir, RuO$_2$, Ru, Pt, PtO, Pd, PdO, ITO, ZnO, IZO, ZITO, SnO$_2$, In$_2$O$_3$, and TiN.

The transparent bonding layer 130 includes a first transparent bonding layer 130a adjacent to the second conductive semiconductor layer 40, and a second transparent bonding layer 130b formed on the first transparent bonding layer 120a in adjacent to the p-n junction diode layer 90.

For instance, the first transparent bonding layer 130a can be formed by using NiO including Au distributed therein, and the second transparent bonding layer 130b can be formed by using ZnO.

The p-n junction diode layer 90 may include first and second p-n junction diode layers 91 and 92 with the n type and p type semiconductor properties. In addition, the p-n junction diode layer 90 can be prepared as a multiple structure including the p-n junctions or the n-p junctions.

For instance, the p-n junction diode layer 90 can be prepared as a single-layer structure or a multiple layer structure by using at least one of Si, Ge, C, SiGe, SiC, SiCN, group II-VI compounds and group III-V compounds.

In detail, the first/second p-n junction diode layers 91 and may include one of p-GaN/n-GaN, p-GaN/n-ZnO, p-Si/n-S p-GaAs/n-GaAs, p-Si/n-ZnO, and p-GaAs/n-ZnO.

The first electrode layer 70 is electrically connected to both of the first conductive semiconductor layer 20 and the p-n junction diode layer 90 in such a manner that the ohmic contact interface can be formed between the first electrode layer 70 and the p-n junction diode layer 90 and between the first electrode layer 70 and the first conductive semiconductor layer 20.

The second electrode layer 60 is electrically connected to both of the second conductive semiconductor layer 40 and the p-n junction diode layer 90 through the transparent bonding layer 130 in such a manner that the ohmic contact interface can be formed between the second electrode layer 60 and the transparent bonding layer 130.

In addition, a reflective layer 160 can be formed under the growth substrate 10. The light generated from the active layer 30 and traveled downward through the growth substrate 10 is reflected upward by the reflective layer 160, so that the light efficiency of the light emitting device can be improved.

The method of manufacturing the light emitting device according to the fourth embodiment is similar to that of the third embodiment except that the transparent bonding layer 130 is employed instead of the reflective bonding layer 120 and the reflective layer 160 can be selectively formed under the growth substrate 10.

Although embodiments have been described with reference to a number of illustrative embodiments thereof, it should be understood that numerous other modifications and embodiments can be devised by those skilled in the art that will fall within the spirit and scope of the principles of this disclosure.

INDUSTRIAL APPLICABILITY

The embodiment is applicable to a light emitting device used as a light source.

The invention claimed is:

1. A light emitting device comprising:
a first conductive semiconductor layer;
an active layer over the first conductive semiconductor layer;
a second conductive semiconductor layer over the active layer;
a bonding layer over the second conductive semiconductor layer;
a schottky diode layer on the bonding layer;
an insulating layer including a first and a second insulating layer, wherein the first insulating layer covers a first portion of an upper surface of the schottky diode layer, a side surface of the schottky diode layer and an upper surface of the bonding layer,
wherein the second insulating layer covers a lateral side of the schottky diode layer and a lateral side of the bonding layer;
a first electrode layer disposed on a portion of an upper surface of the first insulating layer, a side surface of the second insulating layer and a second portion of the upper surface of the schottky diode layer; and
a second electrode layer disposed on the upper surface of the first insulating layer and the upper surface of the bonding layer.

2. The light emitting device of claim 1, further comprising a growth substrate under the first conductive semiconductor layer.

3. The light emitting device of claim 2, further comprising a reflective layer under the growth substrate.

4. The light emitting device of claim 1, wherein the bonding layer is a reflective bonding layer including one of a metal, such as Al, Ag, Rh, Pd, Au, Ni, or Cr, an alloy thereof, a DBR (Distributed Bragg Reflector) and an ODR (Omni-Directional Reflector).

5. The light emitting device of claim 4, wherein the reflective bonding layer includes a first reflective bonding layer adjacent to the second conductive semiconductor layer, and a second reflective bonding layer formed on the first reflective bonding layer in adjacent to the schottky diode layer.

6. The light emitting device of claim 5, wherein the first reflective bonding layer includes Ag or an alloy including Ag, and the second reflective bonding layer includes Al or an alloy including Al.

7. The light emitting device of claim 1, wherein the first electrode layer forms a schottky contact interface with respect to the second portion of the upper surface of the schottky diode layer, and an ohmic contact interface with respect to the first conductive semiconductor layer.

8. The light emitting device of claim 1, wherein the bonding layer forms an ohmic contact interface with respect to the second conductive semiconductor layer, and a schottky contact interface or the ohmic contact interface with respect to the schottky diode layer.

9. The light emitting device of claim 1, wherein the second electrode layer is contacted with a portion of the first insulating layer and a portion of the bonding layer.

10. The light emitting device of claim 1, wherein the first electrode layer is contacted with a portion of the first insulating layer, the second portion of the upper surface of the schottky diode layer, a portion of the second insulating layer and the first conductive semiconductor layer.

11. The light emitting device of claim 1, wherein the first electrode layer faces a portion of the second electrode layer on the surface of the first insulating layer.

12. A light emitting device comprising:
a first conductive semiconductor layer;
an active layer over the first conductive semiconductor layer;
a second conductive semiconductor layer over the active layer;
a bonding layer over the second conductive semiconductor layer;
a p-n junction diode layer on the bonding layer;
an insulating layer including a first and a second insulating layer, wherein the first insulating layer covers a first portion of an upper surface of the p-n junction diode layer, a side surface of the p-n junction diode layer and an upper surface of the bonding layer,
wherein the second insulating layer covers a lateral side of the p-n junction diode layer and a lateral side of the bonding layer;
a first electrode layer disposed on a portion of an upper surface of the first insulating layer, a side surface of the second insulating layer and a second portion of the upper surface of the p-n junction diode layer; and
a second electrode layer disposed on the upper surface of the first insulating layer and the upper surface of the bonding layer.

13. The light emitting device of claim 12, wherein the bonding layer is a reflective bonding layer including one of a metal, such as Al, Ag, Rh, Pd, Au, Ni, or Cr, an alloy thereof, a DBR (Distributed Bragg Reflector) and an ODR (Omni-Directional Reflector), and
the reflective bonding layer includes a first reflective bonding layer adjacent to the second conductive semiconductor layer, and a second reflective bonding layer formed on the first reflective bonding layer in adjacent to the p-n junction diode layer.

14. The light emitting device of claim 12, wherein the first electrode layer forms an ohmic contact interfaces with respect to the second portion of the upper surface of the p-n junction diode layer and the first conductive semiconductor layer, respectively.

15. The light emitting device of claim 12, wherein the second electrode layer is contacted with a portion of the first insulating layer and a portion of the bonding layer.

16. The light emitting device of claim 12, wherein the first electrode layer is contacted with a portion of the first insulating layer, the second portion of the upper surface of the p-n junction diode layer, a portion of the second insulating layer and the first conductive semiconductor layer.

17. The light emitting device of claim 12, wherein a portion of the first electrode layer faces a portion of the second electrode layer on the surface of the first insulating layer.

18. A light emitting device comprising:
a first conductive semiconductor layer;
an active layer over the first conductive semiconductor layer;
a second conductive semiconductor layer over the active layer;
a bonding layer over the second conductive semiconductor layer;
a schottky diode layer on the bonding layer and configured to form a schottky diode;
an insulating layer including a first portion and a second portion, wherein the first portion covers at least a first portion of an upper surface of the schottky diode layer, a side surface of the schottky diode layer and an upper surface of the bonding layer,
wherein the second portion covers at least a portion of a lateral side of the schottky diode layer and a lateral side of the bonding layer;
a first electrode layer disposed on the upper surface of the first portion of the insulating layer, a side surface of the second portion of the insulating layer and at least a second portion of the upper surface of the schottky diode layer; and
a second electrode layer disposed on the upper surface of the first portion of the insulating layer and the upper surface of the bonding layer.

* * * * *